United States Patent [19]

Yamazaki

[11] Patent Number: 4,612,453
[45] Date of Patent: Sep. 16, 1986

[54] INTEGRATED CIRCUIT DEVICE HAVING A CIRCUIT MEANS FOR DETECTING A DISCONNECTION OF INPUT SIGNAL LINE

[75] Inventor: Yuetsu Yamazaki, Tokyo, Japan

[73] Assignee: Nippon Electric Co., Ltd., Tokyo, Japan

[21] Appl. No.: 464,255

[22] Filed: Feb. 7, 1983

[30] Foreign Application Priority Data

Feb. 10, 1982 [JP] Japan ................... 57-19906

[51] Int. Cl.[4] .............. H03K 3/26; H03K 5/153; H03K 5/19
[52] U.S. Cl. ................... 307/303; 307/350; 328/120; 340/652
[58] Field of Search ........... 307/231, 362, 350, 351, 307/354, 200 A, 442, 240, 303, 363, 557, 558; 328/120; 340/650, 652; 371/65, 66

[56] References Cited

U.S. PATENT DOCUMENTS

| | | | |
|---|---|---|---|
| 3,582,665 | 6/1971 | Prozeller | 307/354 |
| 4,115,711 | 9/1978 | Moussie | 307/350 |
| 4,236,146 | 11/1980 | Clark et al. | 340/652 |
| 4,322,634 | 3/1982 | Kaire et al. | 307/200 A |
| 4,385,243 | 5/1983 | Suzuki | 307/350 |

Primary Examiner—Stanley D. Miller
Assistant Examiner—T. P. Callahan
Attorney, Agent, or Firm—Sughrue, Mion, Zinn, Macpeak & Seas

[57] ABSTRACT

A circuit for detecting a disconnected input signal line to an integrated circuit includes an emitter follower stage having a transistor whose base is connected to the monitored input signal line, the input signal being transferred to the integrated circuit through the base-emitter path of the emitter follower. A current source transistor connects to the emitter of the emitter follower transistor, the base of the current source transistor being coupled to a voltage supply and a detector circuit, the detector circuit functioning to detect the base-emitter voltage of the current source transistor. The detected voltage provides an indication of whether or not the input signal line is connected to the base of the emitter follower transistor.

9 Claims, 4 Drawing Figures

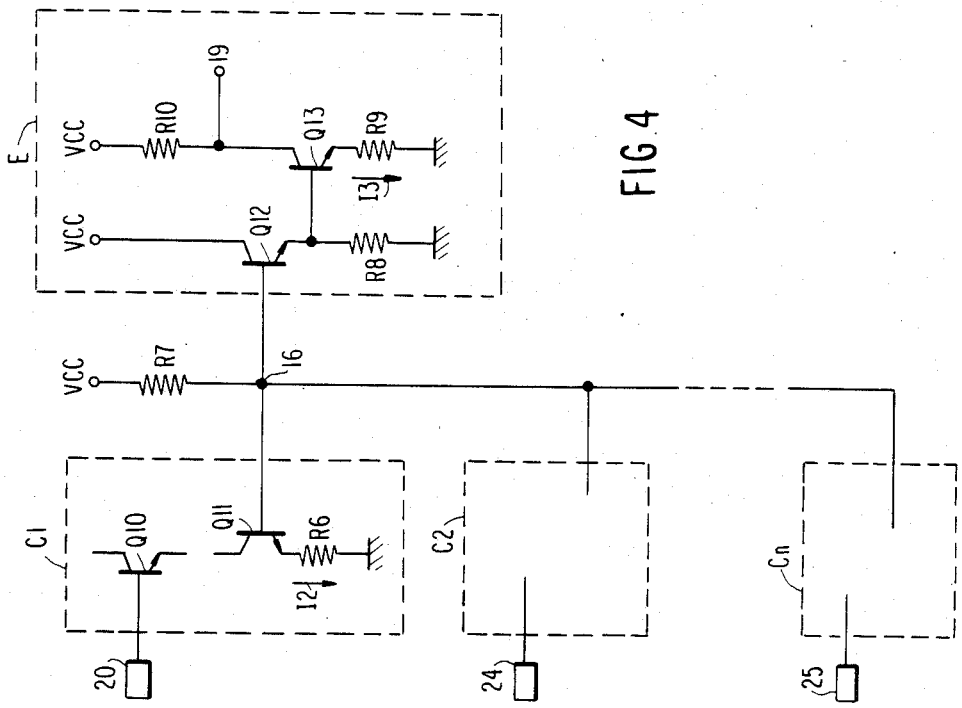
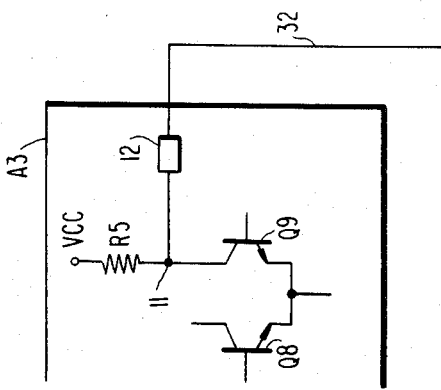
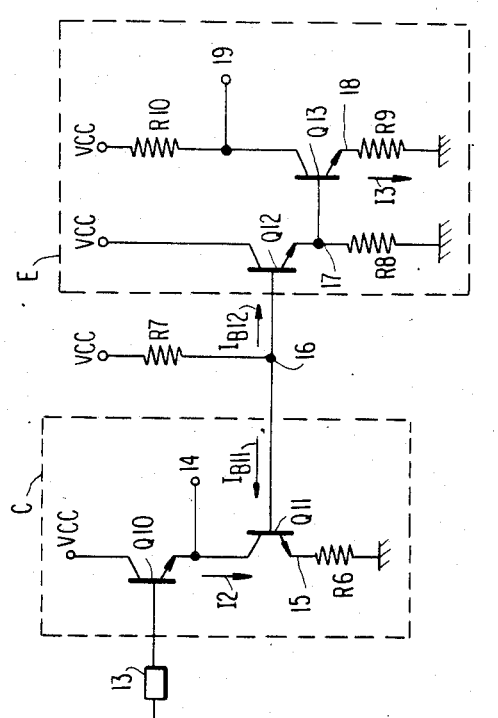
FIG. 4
FIG. 3

INTEGRATED CIRCUIT DEVICE HAVING A CIRCUIT MEANS FOR DETECTING A DISCONNECTION OF INPUT SIGNAL LINE

BACKGROUND OF THE INVENTION

1. Field of the Invention

The present invention relates to a detecting circuit to be incorporated in an integrated circuit device for checking the connected condition of an input signal line to the integrated circuit device.

2. Description of the Prior Art

The integrated circuit device has a semiconductor chip with an electrical circuit formed integrally therein, a package housing the semiconductor chip, and external leads attached to the package and electrically connected within the package to electrodes of the semiconductor chip. In practical application, the external leads of the integrated circuit device are inserted into terminals of an IC socket which is in turn attached to a printed circuit board. An electronic system usually employs a number of the integrated circuit devices. If happens sometimes, however, that the contact between one or more terminals of the IC socket and the associated external leads of the integrated circuit device is incomplete or disconnected. This causes the disconnection of a signal line and obstructs a predetermined operation of the electronic system even if its circuit construction and all the integrated circuit devices employed therein are normal. This disconnection of the signal line is remarkably difficult to visually discover and may be difficult to discover by an operational analysis. It is required that the connected condition of the signal line can be easily as the whole system becomes more complicated. While the detection of the disconnection in an output signal line of an integrated circuit device is relatively easy because the connection of the output signal line can be detected by checking the output signal on a printed circuit board, the detection of the input signal line disconnection is very difficult. This detection of the disconnection of the input lead of an integrated circuit is more important than the output lead disconnection, because the connected condition of the output lead can be easily detected by checking the output signal.

A circuit for detecting the disconnection on the input side of an integrated circuit has been proposed in U.S. Pat. No. 4,183,460 granted to Raymond C. Yuen. According to this detection circuit, an input signal is supplied from an input lead of an integrated circuit device via an input electrode on a semiconductor chip to the base of an emitter-follower transistor formed in the semiconductor chip which has its emitter fed with a constant current, and a detecting transistor is also formed in the chip to construct a differential amplifier together with the emitter-follower transistor. A reference voltage lower than not only the high level but also the low level of the input signal is supplied to the base of the detecting transistor. The emitter of the detecting transistor is connected with the emitter of the emitter-follower transistor. The input signal fed to the base of the emitter follower transistor is led out of the emitter thereof and applied to an input of an integrated circuit formed on the same chip.

According to the detecting circuit in the prior art, when an input lead of the integrated circuit device is disconnected to a terminal of an IC socket, the detecting transistor is rendered conductive, so that the connected condition of the input signal line can be detected by checking the collector voltage of that detecting transistor. Since the detecting transistor is connected to the emitter of the emitter-follower transistor, however, there arises a parasitic capacitor based upon the detecting transistor at the emitter of the emitter-follower transistor from which the input signal is derived. This results in a long transmission time of the input signal so that the applicable frequency limit of the input signal is lowered. Another disadvantage is that one detecting transistor has to be added with respect to each of the input electrodes of the semiconductor chip so that the number of the additional transistors is inevitably increased in a large-scale integrated circuit device having a number of input leads.

SUMMARY OF THE INVENTION

A primary object of the present invention is to provide a circuit for detecting a disconnection of an input signal line which does not increase the input signal transmission time and which is to be suitably built in an integrated circuit.

Another object of the present invention is to provide a circuit for detecting a disconnection of an input signal line which requires a small number of elements.

According to the present invention, there is provided a detection circuit comprising an emitter-follower transistor having its base coupled to an input terminal, a current-source transistor having its collector connected in series with the emitter of the emitter-follower transistor to feed a constant current to the emitter-follower transistor, means for extracting the input signal from the emitter of the emitter-follower transistor, means for feeding a current to the base of the current-source transistor, a detecting transistor having its base connected with the base of the current-source transistor, and means for detecting the cut-off condition of the detecting transistor.

Since the detecting transistor is connected not to the emitter of the emitter-follower transistor but to the base of the current-source transistor, the path of the input signal from the base to the emitter of the emitter-follower transistor, is equipped with neither the detecting transistor nor the means for detecting the cut-off condition of the detecting transistor. As a result, no parasitic capacitance is added to the path of the input signal. Thus, the transmission period of the input signal is not elongated and the operating frequency of the integrated circuit is not lowered.

According to the present invention, moreover, the number of detecting transistors need not be increased when the input leads of the integrated circuit device are two or more. In this case, the numbers of the emitter-follower and current-source transistors are increased in accordance with the number of the input leads, so long as the input signals are received by the emitter-follower stage and, the means for feeding the current to the base of the current-source transistor, the detecting transistor and the means for detecting the cut-off condition of the detecting transistor can be used commonly therefor. With the increase in the number of the input terminals, therefore, the number of the additional elements required for detecting the disconnection of the input signal line is left unchanged. Thus, the disconnection of the input signal line can be detected by the use of a small number of additional elements.

BRIEF DESCRIPTION OF THE DRAWINGS

The above and further objects, features and advantages of the present invention will become more apparent from the following description taken in conjunction with the accompanying drawings, wherein;

FIG. 3 is a circuit diagram showing a first embodiment of the present invention; and FIG. 4 is a circuit diagram showing a second embodiment in which the detection circuit of FIG. 3 is applied to an integrated circuit device with a plurality of input terminals.

DETAILED DESCRIPTION

Figure 1:
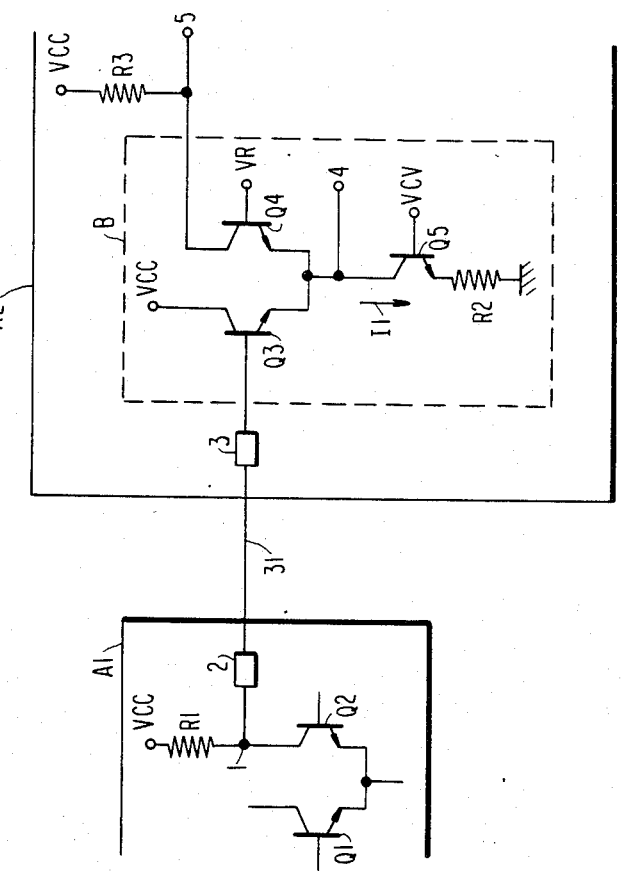
FIG. 1 is a circuit diagram showing a circuit for detecting a disconnection of an input lead of an integrated circuit device with an external input signal line according to the prior art.

According to the prior art shown in FIG. 1, the signal generated at an output terminal 2 of a chip $A_1$ having an output circuit including transistors $Q_1$ and $Q_2$ and a resistor $R_1$ is fed as an input signal to an input terminal 3 of a chip $A_2$ having an input block B. In the input block B, this input signal is fed to the base of the transistor $Q_3$ and extracted through a terminal 4 from the emitter of the same transistor $Q_3$. This transistor $Q_3$ forms an emitter-follower input stage together with a transistor $Q_5$ having its base held at a constant voltage $V_{cv}$ and its emitter grounded to the earth through a resistor $R_2$. Incidentally, the transistor $Q_5$ operates as a current source. A transistor $Q_4$ is added for detecting the disconnection a signal line 31 between the input terminal 3 and the output terminal 2 and has its emitter connected with the emitter of the transistor $Q_3$ and its base held at a reference voltage $V_R$. The output of this transistor $Q_4$ appears across a resistor $R_3$, which is connected with the collector of the transistor $Q_4$, so that it is obtained from an output terminal 5. The terminals 2 and 3 are electrodes on the semiconductor chips $A_1$ and $A_2$, respectively, but they may be regarded as external leads of the integrated circuit devices which contain the chips $A_1$ and $A_2$, respectively.

Here, the signal at an output node 1 is set to have a high level $V_{CC}$ and a low level $V_l$, and the reference voltage $V_R$ applied to the transistor $Q_4$ is set at a lower level than the low level $V_l$. Now, if the output terminal 2 of the chip $A_1$ and the input terminal 3 of the chip $A_2$ are connected so that the voltage at the node 1 may be applied to the base of the transistor $Q_3$, the current $I_1$ from the current source (the transistor $Q_5$ and the resistor $R_2$) will flow through the transistor $Q_3$ at all times irrespective of the high or low level of the signal at the output terminal 2 so that the transistor $Q_4$ is held under a cut-off condition. As a result, the voltage at the terminal 5 takes the high level $V_{cc}$. In the case where the input signal line 31 is complete between the input terminal 3 and the output terminal 2, the transistor $Q_3$ acts as an emitter-follower transistor so that an emitter-follower output responsive to the input signal at the input terminal 3 is obtained at the terminal 4.

If there is a disconnection in the signal line 31 between the output terminal 2 of the chip $A_1$ and the input terminal 3 of the chip $A_2$, however, the transistor $Q_3$ becomes cut off because it has no base current flowing. As a result, the current $I_1$ flows through the transistor $Q_4$ and the resistor $R_3$ so that the terminal has a voltage of $(V_{cc}-I_1 \times R_3)$. In this way, the disconnection, if any, between the output terminal 2 and the input terminal 3 can be discovered by measuring the voltage at the terminal 5.

Figure 2:
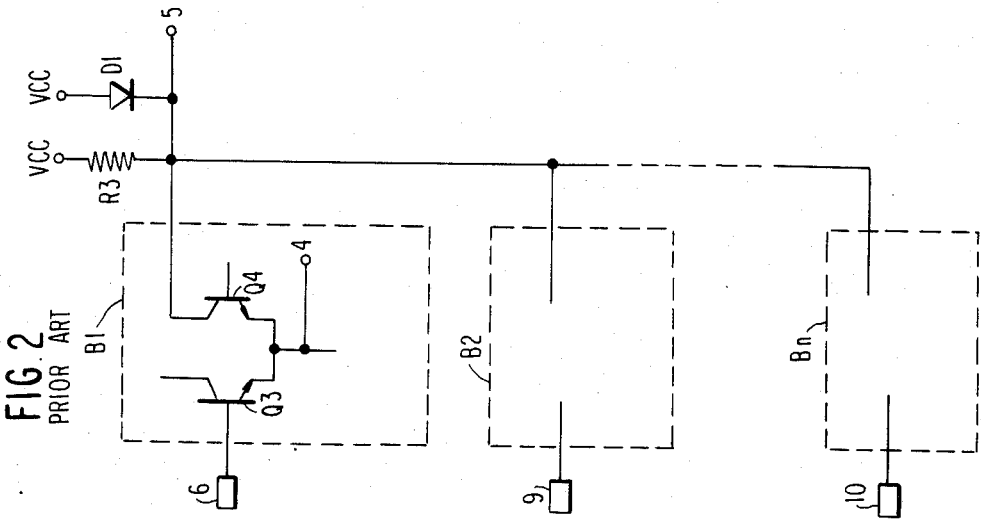
FIG. 2 is a circuit diagram showing the case in which the detection circuit of FIG. 1 is applied to an integrated circuit device with a plurality of input terminals.

FIG. 2 shows the case where the circuits of FIG. 1 are applied to a plurality of input terminals 6, 9 and 10. All the circuit blocks $B_1$, $B_2$, and $B_n$ are similar to that which is indicated as a block B in FIG. 1 and have the same circuit of the transistors $Q_3$, $Q_4$ and $Q_5$, the resistor $R_2$ and the terminal 4. These circuit blocks $B_1$, $B_2$ and $B_n$ are respectively connected with the terminals 6, 9 and 10. The collectors of the transistors $Q_4$ of the respective blocks $B_1$, $B_2$ and $B_n$ are commonly connected with the parallel circuit of the resistor $R_3$ and diode $D_1$, and with the detection output terminal 5. Incidentally, the diode $D_1$ is used to determine the output voltage when the input signal line is disconnected, and can be dispensed with.

According to this arrangement, if all the input terminals 6, 9 and 10 are completely connected with the external signal line, the currents $I_1$, from the respective current sources respectively flow through the transistors $Q_3$ in the circuit blocks $B_1$, $B_2$ ... $B_n$, as described with reference to FIG. 1. Therefore, the detection output terminal 5 has the voltage $V_{cc}$. However, when one or more input terminals 6, 9 and 10 are open, the transistor or transistors connected with the open input terminal or terminals become cut off so that current is fed to the resistor $R_3$ from the circuit block or blocks connected to the open input terminal or input terminals. As a result, the voltage at the detection output terminal 5 is dropped from the level $V_{cc}$ to an extent corresponding to the forward voltage of the diode $D_1$. Thus, when the detection output terminal 5 has the voltage $V_{cc}$, it indicates that all the input terminals 6, 9 and 10 are connected with the output terminals of the other chips. When the voltage at the detection output terminal 5 is dropped from the level $V_{cc}$ by the voltage which is determined by the resistor $R_3$ or diode $D_1$ connected with the voltage $V_{cc}$ it indicates that there has arisen a disconnection in a signal line to at least one of the input terminals 6, 9 and 10.

In the circuit for detecting the input signal line disconnection in the prior art, however, the transistor $Q_4$ is indispensable for detecting the disconnection with each of the emitter-follower stages. As a result, the capacity of the transistor $Q_4$ is added to elongate the transmission period of the input signal and further to drop the operable frequency of the integrated circuit. Since, moreover, the number of the transistors $Q_4$ has to be the same as that of the input terminals, as is apparent from FIG. 2, the number of transistors is undesirably increased in case there are provided a number of input terminals, as in the large-scale integrated circuit of these recent years.

The preferable embodiments of the present invention will be described in the following. With reference to FIG. 3, a signal is generated at an output node 11 by the coactions of transistors $Q_8$ and $Q_9$ and a resistor $R_5$ all belonging to a chip $A_3$. This signal is fed from an output terminal 12 (an electrode on the chip $A_3$ or an external lead of the device containing the chip $A_3$) via a signal line 32 to the input terminal 13 (an electrode or an external lead) of a chip $A_4$. In this chip $A_4$, this signal is supplied to the input block C and derived from a terminal 14 to transmit it to a signal processing part (not shown) in the chip $A_4$.

The chip $A_4$ is provided with the input block C and a detector block E. The block C includes a transistor $Q_{10}$ having a base receiving an input signal from the input terminal 13, a collector supplied with the power voltage $V_{cc}$ and an emitter connected with the collector of a transistor $Q_{11}$. The base of the transistor $Q_{11}$ is connected with a node 16 and the emitter thereof is grounded to the earth through a resistor $R_6$. This circuit arrangement of the transistors $Q_{10}$ and $Q_{11}$ and the resistor $R_6$ operates as an emitter-follower stage in which the transistor $Q_{11}$ and the resistor $R_6$ form a current source. It should be noted that a resistor $R_7$ receiving the voltage $V_{cc}$ and connected to the node 16 is a current feeder for feeding a current to the base of the transistor $Q_{11}$ and also to the base of a transistor $Q_{12}$.

The detector block E has the transistor $Q_{12}$ and further includes a transistor $Q_{13}$ and resistors $R_8$ to $R_{10}$. The transistor $Q_{12}$ receives the power voltage $V_{cc}$ at its collector and has a connection with the base of the transistor $Q_{13}$ and the resistor $R_8$ at its emitter. The other end of the resistor $R_8$ is grounded. The emitter of the transistor $Q_{13}$ is grounded through the resistor $R_9$ and the collector thereof is connected with the resistor $R_{10}$ and a detection output terminal 19. The other end of the resistor $R_{10}$ receives the power voltage $V_{cc}$. The circuit of the detector block E detects the voltage change at the node 16 and produces a detection output at the detection output terminal 19.

According to one example of the resistance values, the following resistances are preferably selected for the power voltage of 3.3 volts.

TABLE 1

| Resistor | Resistance | Resistor | Resistance |
| --- | --- | --- | --- |
| $R_5$ | 59 ohm | $R_6$ | 1.18K ohm |
| $R_7$ | 32.5K ohm | $R_8$ | 1.22K ohm |
| $R_9$ | 159 ohm | $R_{10}$ | 1.15K ohm |

Here, we will describe hereunder how to select the resistance of the resistor $R_6$.

If it is too small, all the current flowing through the resistor $R_7$ flows through the transistor $Q_{11}$ and the resistor $R_6$ to drive the transistor $Q_{12}$ into cut off condition.

If it is too large, the transistor $Q_{12}$ keeps its conducting state irrespective of the connecting condition of the terminal 13. More accurately, when the input terminal 13 is open, the base current of the transistor $Q_{11}$ increases, as will be fully explained later. But, the change in current is not enough, due to the large resistance resistor $R_6$, for turning transistors $Q_{12}$ and $Q_{13}$ to cut-off. Therefore, the resistance of the resistor $R_6$ should be selected so that the transistor $Q_{12}$ may conduct in response to the connection of the signal line 32 between the terminals 12 and 13 and may cut off in response to the disconnection of the signal line 32. The most preferable resistance may be expressed by the following equation.

$$R_6 = \frac{V_{18} + V_{BE}}{I_2 \left( \frac{1 + \beta}{\beta} \right)}$$

where $V_{18}$ is an emitter voltage of the transistor $Q_{13}$, $V_{BE}$ is a base-emitter forward voltage of transistor, $I_2$ is a constant current from the collector of the transistor $Q_{11}$ and $\beta$ is a current gain of the transistors.

Next, the operation of the detector block E will be explained together with the input block C. When the terminals 12 and 13 are connected to each other, the transistors $Q_{10}$ and $Q_{11}$ operate as an emitter follower so that the transistor $Q_{11}$ supplies a constant current $I_2$. Since the transistor $Q_{11}$ is biased to operate as a normal active device, its base current $I_{B11}$ is small. The base current $I_{B11}$ is typically 0.02 mA, if the resistances shown in Table 1 are employed. The node 16 maintains its predetermined constant voltage $V_{16}$ of $V_{cc} - R_7 \times (I_{B11} + I_{B12})$ where $I_{B12}$ is a base current of the transistor $Q_{12}$. The values of the voltage $V_{16}$ and the current $I_{B12}$ of the typical example shown in Table 1 are 2 volts and 0.02 mA, respectively. This voltage $V_{16}$ drives the transistor $Q_{12}$ into on state and also drives the transistor $Q_{13}$ into a conducting state. Thus, the voltage $V_{19}$ at the detection output terminal 19 becomes about a value of $(V_{CC} - I_3 \times R_{10})$ where $I_3$ is an emitter current of the transistor $Q_{13}$ which is substantially same as the collector current thereof. According to the typical example shown in Table 1, the values of the voltage $V_{19}$ and the current $I_3$ are 0.654 volts and 2.04 mA.

On the other hand, when the terminal 13 is under an open condition, the transistor $Q_{10}$ becomes cut-off to prevent the constant current $I_2$ from flowing therethrough. Under this condition, the transistor $Q_{11}$ saturates and no longer operates as a normal transistor. Its base-emitter junction operates as a diode. The base current of the transistor thus saturated is generally several times as much as the base current of the normally operating transistor but lower than the emitter current of the normally operating transistor. The base current $I_{B11}$ of the transistor $Q_{11}$ rises to 0.074 mA in the typical example. The voltage $V_{16}$ at the node 16 is lowered to 0.89 volts to drive transistors $Q_{12}$ and $Q_{13}$ into a cut-off condition. The voltage $V_{19}$ at the detection output terminal 19 rises to $V_{CC}$.

As explained above, the voltage $V_{19}$ at the detection output terminal 19 of the detector block E indicates the connected or disconnected condition of the signal line 32 between the terminals 12 and 13. More specifically, the voltage $V_{cc}$ at the detection output terminal 19 shows that the input terminal 13 is open. The voltage of $(V_{cc} - I_3 \times R_{10})$ at the detection output terminal 19, on the other hand, shows that terminals 12 and 13 are connected.

According to the embodiment thus far described, the path of the input signal in the input block C is the base-emitter path of the transistor $Q_{10}$ and is only connected with the transistors $Q_{10}$ and $Q_{11}$ which are indispensable so long as an input signal is received with the emitter-follower stage. The input signal path is isolated from the detector block E and no parasitic capacity is added thereto by the detector block E. Consequently, neither the elongation of the transmission period of the input signal nor the drop of the operational frequency of the integrated circuit arises.

Turning now to FIG. 4 showing a second embodiment of the present invention, input blocks $C_1$, $C_2$, - - - , and $C_n$ corresponding to the block C of FIG. 3 are respectively connected with input terminals 20, 24, 25 and so on, and the current source transistors $Q_{11}$ of the respective stages $C_1$, $C_2$, - - - , and $C_n$ have their bases commonly connected with the node 16. With this node 16, there are further connected both the resistor $R_7$ and a single detector block E identical to the detector block E shown in FIG. 3. The resistances shown in Table 1 except for the resistance $R_7$ are similarly applied as a typical example. The resistance $R_7$ is 3.1 KΩ when the number of the input blocks is 20. When the number of the input blocks $C_1, C_2 \ldots C_n$ is "n", the optimum resistance $R_7$ may be expressed as follows:

$$R_7 = \frac{V_{cc} - V_{16}}{n \times I_{B11} + I_{B12}}$$

Here, when the input terminals 20, 24, 25 and so on are respectively connected with the output terminals of other chips, the emitter-follower stages in the blocks $C_1$, $C_2$, - - -, and $C_n$ perform their normal operations. As a result, all the current source transistors $Q_{11}$ of the emitter-follower stages in the blocks $C_1, C_2, $ - - -, and $C_n$ allow the currents by the normal transistor operations to flow through the bases thereof. As a result, the voltage $V_{16}$ at the node 16 keeps the constant voltage of 2 volts. This constant voltage $V_{16}$ renders the transistor $Q_{13}$ conductive, as has been described in the above, to allow an emitter current $I_3$ to flow so that a voltage substantially at a level of $(V_{cc} - I_3 \times R_{10})$ is generated at the detection output terminal 19. The values of the emitter current $I_3$ and the voltage $V_{19}$ are 2.04 mA and 0.654 volts which are similar to the first embodiment.

In case one or more connections between the input terminals 20, 24, 25 and so on of the respective input blocks $C_1, C_2,$ - - -, and $C_n$ and the output terminals of the other chips are broken, the current source transistor $Q_{11}$ of the emitter-follower stage, which is connected with that broken input terminal, is saturated to allow such a base current to flow as exceeds the base current in the normal transistor operation. As a result, the voltage $V_{16}$ at the node 16 drop to 1.34 volts, as has been described hereinbefore, so that the transistor $Q_{13}$ of the detector block E becomes cut off. As a result, the voltage $V_{19}$ at the detection output terminal 19 takes the level $V_{cc}$.

Thus, the voltage $V_{19}$ of $(V_{cc} - I_3 \times R_{10})$ indicates that all the input terminals of the input blocks $C_1, C_2,$ - - -, and $C_n$ are connected completely with the output terminals of the other chips. On the other hand, the voltage $V_{19}$ of the voltage $V_{cc}$ shows that one or more of the input terminals 20, 24, 25 and so on are disconnected.

As has been described in the embodiment under discussion, only one set of additional elements such as the resistor $R_7$ and the detector block E is sufficient for detecting the open condition of the input terminals, even if the number "n" of the input terminals is increased. The number of the emitter-follower stages in the circuit block $C_1, C_2,$ - - -, and $C_n$ are necessary as the input means, so far as the input signals are received with emitter-followers. Thus, the number of the circuit elements required for detecting the disconnection of the input signal line is not increased even if the number of the input terminals is increased.

The detection output voltage $V_{19}$ at the detection output terminal 19 may be utilized internally within the chip A4. It is favorable, however, to provide a detection output electrode (not shown) on the chip A4 to which the detection output terminal 19 is connected, in order that the result of the disconnection detection be accessed from the outside via an external lead of the integrated circuit device connected to the detection output electrode. Alternatively, the detection output terminal 19 may be connected to another electrode on the chip A4 which is an output electrode of another signal processing part on the same chip A4, and from that electrode either the detection output voltage $V_{19}$ or the output signal of the signal processing part is outputted by a function selecting signal.

A variety of modifications of the present invention can be conceived. For example, since the transistor $Q_{13}$ is used to detect the cut-off condition of the transistor $Q_{12}$, a resistor may be connected between the collector of the transistor $Q_{12}$ and the voltage $V_{cc}$, and the base of the transistor $Q_{13}$ may be connected with the collector of the transistor $Q_{12}$. It is also possible to omit the transistor $Q_{13}$ and the resistors $R_9$ and $R_{10}$ by inserting a load resistor between the collector of the transistor $Q_{12}$ and the power voltage $V_{cc}$ or by connecting the terminal 19 with the emitter of the transistor $Q_{12}$.

According to these modifications, there can be attained advantages that the detected output becomes contrary to that of the foregoing embodiment so that the transistor $Q_{13}$ is cut off, when the input signal line is connected, and that the current flowing through the detector block E is reduced, compared to the embodiments described above. However, in order to obtain a reliable detection of the voltage $V_{16}$ by the transistor $Q_{12}$, it is necessary to connect a diode between the node 16 and the resistor $R_8$ in the forward direction.

As has been described hereinbefore, according to the present invention, since the change in the base current of the current-source transistor is detected at the base of the current-source transistor whose collector is connected to the emitter of the emitter-follower transistor, the time period necessary to transmit the input signal through the emitter of the emitter-follower transistor is not prolonged. There can be attained, moreover, another merit that it is possible to detect the open condition of the plural number of input terminals by the use of a small number of circuit elements.

What is claimed is:

1. A semiconductor integrated circuit including a circuit for detecting disconnection of a signal line from an input terminal, said detecting circuit comprising:
   first and second power terminals, a power voltage being supplied between said first and second power terminals;
   an emitter follower transistor (Q10) having a base d.c. coupled to said input terminal, a collector d.c. coupled to said first power terminal and an emitter said emitter follower transistor transfering a signal at said input terminal to its emitter;
   a load transistor (Q11) for said emitter follower transistor having a collector d.c. coupled to the emitter of said emitter follower transistor, an emitter d.c. coupled to said second power terminal and a base;
   a means (R7) for supplying a base current for said load transistor, said supplying means being inserted between said first power terminal and the base of said load transistor; and
   a detection output circuit powered by said power voltage and having an input port receiving the potential at the base of said load transistor, and an output port producing a first output potential when said signal line is connected to said input terminal and a second output potential different from said first output potential when said signal line is not connected to said input terminal.

2. A semiconductor integrated circuit as claimed in claim 1, wherein said detection output circuit includes means for producing said second output potential in response to an increase in a base current of said lead transistor which is caused by the cut-off state of said emitter follower transistor when the base of said emitter follower transistor is disconnected from said signal line.

3. A semiconductor integrated circuit as claimed in claim 2, wherein said detection output circuit comprises a third transistor (Q12) having a base connected to said input port, a collector d.c. coupled to said first power terminal and an emitter, a fourth transistor (Q13) having a base connected to the emitter of said third transistor, an emitter d.c. coupled to said second power terminal and a collector connected to said output port and a load resistor (R10) inserted between said output port and said first power terminal.

4. A semiconductor integrated circuit as claimed in claim 1, wherein said detecting circuit further comprises another input terminal, another emitter follower transistor having a base coupled to said another input terminal, and another load transistor for said another emitter follower transistor, an emitter of said another emitter follower transistor being coupled to the collector of said another load transistor, the base of said another load transistor being coupled to said supply means.

5. A semiconductor integrated circuit as claimed in claim 3, wherein said detecting circuit further comprises another input terminal, another emitter follower transistor, and another load transistor, said another input terminal being coupled to the base of the said another emitter follower transistor, the emitter of said another emitter follower transistor being coupled to the collector of said another load transistor, the base of said another load transistor being coupled to said supplying means.

6. A semiconductor integrated circuit including a circuit for detecting disconnection of a signal line from an input terminal, said detecting circuit comprising:
   an input terminal (13) connected to said signal line (32) for receiving an input signal;
   first and second power terminals, a power voltage being supplied between said first and second power terminals;
   a first transistor (Q10) having a base connected to said input terminal, a collector connected to said first power terminal and an emitter;
   a second transistor (Q11) having a collector connected to the emitter of said first transistor, an emitter coupled to said second power terminal through a first resistor (R6) and a base, said first transistor operating as an emitter follower with a load of said second transistor and said first resistor;
   a second resistor (R7) inserted between said first power terminal and the base of said second transistor;
   a third transistor (Q12) having a base connected to the base of said second transistor, a collector coupled to said first power terminal and an emitter connected to said second power terminal through a third resistor (R8);
   a fourth transistor (Q13) having a base connected to the emitter of said third transistor, a collector connected to said first power terminal through a fourth resistor (R10) and an emitter connected to said second power terminal through a fifth resistor (R9); and
   a detection terminal (19) connected to the collector of said fourth transistor, whereby a large part of the current flowing through said second resistor is supplied to said base of said third transistor when said input terminal is connected to said signal line, and a large part of the current flowing through said second resistor flows into the base of said second transistor, when said input terminal is under an open condition and said first transistor turns off.

7. An integrated circuit device having a plurality of input terminals, each to be connected to a respective signal line for receiving a respective input signal and including a circuit for detecting disconnections of signal lines from corresponding input terminals, said detecting circuit comprising:
   first and second power terminals, a power voltage being supplied between said first and second power terminals;
   a plurality of emitter follower transistors (Q10), each having a base d.c. coupled to one of said input terminals, a collector d.c. coupled to said first power terminal and an emitter, each of said emitter follower transistor transferring an input signal at its corresponding input terminal to the emitter thereof;
   a plurality of lead transistors (Q11) for said emitter follower transistor, each having a collector d.c. coupled to said second power terminal and a base;
   a means (R7) for supplying base currents to said load transistors, said supplying means being inserted between said first power terminal and the bases of said load transistors; and
   a detection output circuit powered by said power voltage and having an input port receiving the potentials at the bases of said load transistors, and an output port producing a first output potential when all of said signal lines are connected to their corresponding input terminals and a second output potential different from said first output potential when at least one of said signal lines is not connected to its corresponding input terminal.

8. An integrated circuit as claimed in claim 7, wherein said detection output circuit includes means for producing said second output potential in response to an abnormally large flow of base current to at least one of second transistors.

9. An integrated circuit as claimed in claim 8, wherein said detection output circuit includes a third transistor (Q12) having a base connected to said input port, a collector d.c. coupled to said first power terminal and an emitter, a fourth transistor (Q13) having a base connected to the emitter of said third transistor, an emitter d.c. coupled to said second power terminal and a collector connected to said output port and a load resistor (R10) inserted between said output port and said first power terminal.

* * * * *

UNITED STATES PATENT AND TRADEMARK OFFICE
CERTIFICATE OF CORRECTION

PATENT NO. : 4,612,453

DATED : September 16, 1986

INVENTOR(S) : Yuetsu Yamazaki

It is certified that error appears in the above-identified patent and that said Letters Patent is hereby corrected as shown below:

Column 1, line 34, after "easily" insert -- checked --.

Signed and Sealed this

Twenty-eighth Day of April, 1987

Attest:

DONALD J. QUIGG

*Attesting Officer*   *Commissioner of Patents and Trademarks*